US006291780B1

United States Patent
Schleife et al.

(10) Patent No.: US 6,291,780 B1
(45) Date of Patent: Sep. 18, 2001

(54) METHOD AND DEVICE FOR CONNECTING FPCS

(75) Inventors: Bernd Schleife, Huckeswagen; Wulf Bramesfeld, Wulfrath; Frank Schliep, Bochum; Tarik Gunay, Neuss, all of (DE)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/206,041

(22) Filed: Dec. 4, 1998

(30) Foreign Application Priority Data

Dec. 23, 1997 (DE) .............................. 197 57 719

(51) Int. Cl.[7] .................................. H05K 1/14
(52) U.S. Cl. .................. 174/267; 174/266; 361/784; 439/65
(58) Field of Search .................. 174/250, 261, 174/263, 266; 29/524.1; 761/784; 361/865; 439/74, 65

(56) References Cited

U.S. PATENT DOCUMENTS

| | | | |
|---|---|---|---|
| 3,409,732 | 11/1968 | Dahlgren et al. | 174/266 |
| 3,446,908 | 5/1969 | Tally et al. | 174/254 |
| 4,133,592 * | 1/1979 | Cobaugh et al. | 439/74 |
| 4,863,387 * | 9/1989 | Snaper et al. | 439/65 |
| 5,281,770 * | 1/1994 | Kamei et al. | 174/261 |
| 5,730,607 * | 3/1998 | Darty | 439/74 |

FOREIGN PATENT DOCUMENTS

| | | |
|---|---|---|
| 1590615 | 10/1970 | (DE) . |
| 2624666 | 12/1976 | (DE) . |
| 2014368A | 8/1979 | (GB) . |

\* cited by examiner

Primary Examiner—Albert W Paladini
(74) Attorney, Agent, or Firm—Richard A. Jones

(57) ABSTRACT

A method of, and device (10) for, connecting a plurality of flexible printed circuits (12) each comprising a layer (14) of electrically insulating material and a layer (16) of electrically conducting material. The method including the steps of forming a hole (18) through each flexible printed circuit; positioning first and second substantially rigid plates (20,22) of electrically insulating material on either side of the flexible printed circuits with the holes in the flexible printed circuits aligned with a corresponding hole (26,28) in each plate; extending a rivet (24) of electrically conducting material through the aligned holes to electrically connect with the layers of electrically conducting material on the flexible printed circuits; and enlarging the ends (30,32) of the rivet to secure the flexible printed circuits between the plates. Provides an improved electrical and mechanical connection between FPCs.

9 Claims, 2 Drawing Sheets

METHOD AND DEVICE FOR CONNECTING FPCS

TECHNICAL FIELD

The present invention relates to a method of, and device for, connecting a plurality of flexible printed circuits (FPCs).

BACKGROUND OF THE INVENTION

A flexible printed circuit comprises a layer of electrically insulating material and a layer of electrically conducting material (usually copper). Where there is a requirement to electrically connect the layers of electrically conducting material of a plurality of flexible printed circuits, it is usual practice to make the electrical connection by way of soldering or by crimping. However, in either of these known arrangements, it is only possible to connect a pair of flexible printed circuits in one step. Where there is a requirement to join several FPCs, this is only possible by using several intermediate connections.

SUMMARY OF THE INVENTION

It is an object of the present invention to provide an improved method of, and device for, electrically connecting the layers of electrically conducting material of a plurality of flexible printed circuits, and, at the same time, provide an improved mechanical connection between the flexible printed circuits.

A method in accordance with the present invention of connecting a plurality of flexible printed circuits each comprising a layer of electrically insulating material and a layer of electrically conducting material, comprises the steps of forming a hole through each flexible printed circuit; positioning first and second substantially rigid plates of electrically insulating material on either side of the flexible printed circuits with the holes in the flexible printed circuits aligned with a corresponding hole in each plate; extending a rivet of electrically conducting material through the aligned holes to electrically connect with the layers of electrically conducting material on the flexible printed circuits; and enlarging the ends of the rivet to secure the flexible printed circuits between the plates.

The present invention also includes a device for connecting a plurality of flexible printed circuits each comprising a layer of electrically insulating material and a layer of electrically conducting material, and each having a hole therethrough, the device comprising a first substantially rigid plate of electrically insulating material having a hole therethrough; a second substantially rigid plate of electrically insulating material having a hole therethrough; and a rivet of electrically conducting material, the rivet extending through, in sequence, the hole in the first plate, the holes in the flexible printed circuits, and the hole in the second plate, the rivet being sized to make an electrical connection with the layer of electrically conducting material on each flexible printed circuit, and the rivet having an enlarged head at each end to secure the flexible printed circuits between the first and second plates.

The present invention removes the need for soldering or crimping, thereby reducing assembly complexity. The device in accordance with the present invention jointly provides an electrical connection and a mechanical connection between a plurality of flexible printed circuits in one operation.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
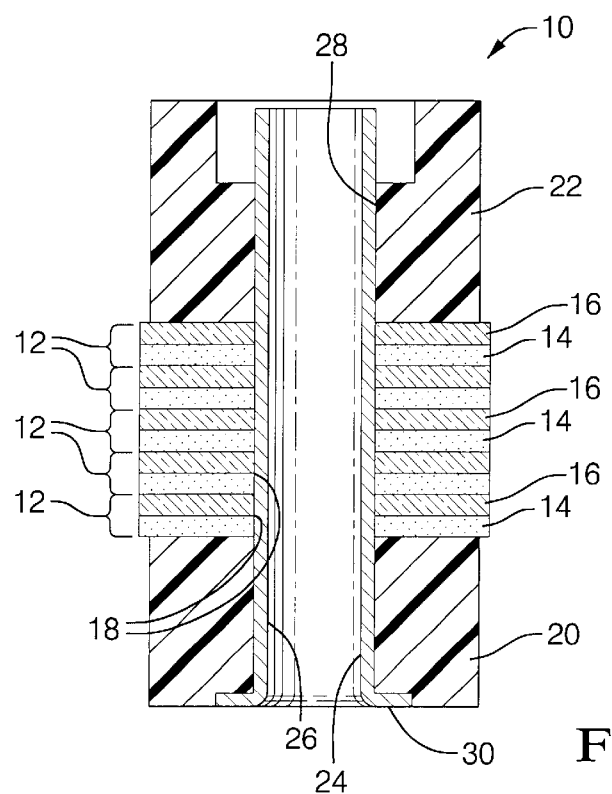
FIG. 1 is a cross-sectional view of a device in accordance with the present invention during assembly.
Figure 2:
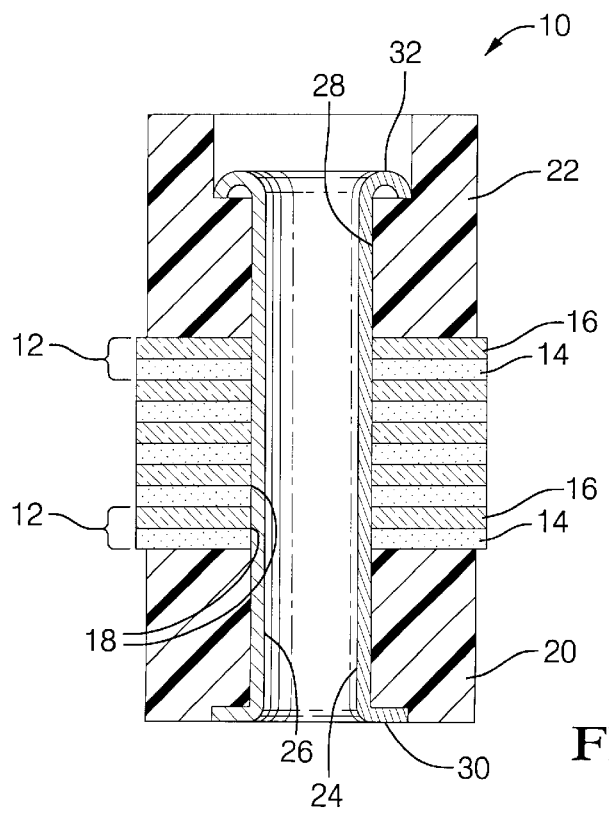
FIG. 2 is a cross-sectional view of the device of FIG. 1 after assembly.

Referring to the drawings, the device 10 in accordance with the present invention provides an electrical and mechanical connection between a plurity of flexible printed circuits (FPCs) 12. Each FPC 12 comprises a layer 14 of electrically insulating material and a layer 16 of electrically conducting material. A connection hole 18 is formed through each FPC 12. The connection holes 18 are formed either by stamping each hole individually in each FPC 12, or by laying the FPCs on top of one another and then stamping the connection holes in a single operation.

The device 10 comprises a first substantially rigid plate 20 of electrically insulating material (preferably plastics material), a second substantially rigid plate 22 of electrically insulating material (preferably plastics material), and a tubular rivet 24 of electrically conducting material (preferably copper). Plate 20 has a first plate hole (26) therethrough and plate 22 has a second plate hole 28 therethrough. The rivet 24 has an enlarged head 30 at one end which is preferably preformed by any suitable method. During assembly, the rivet 24 is passed through the first plate hole 26 in the first plate 20, then the rivet 24 is passed through the aligned connection holes 18 in the FPCs 12, and finally through the second plate hole 28 in the second plate 22. The enlarged head 30 engages the first plate 20. The other end of the rivet 24 is then deformed by any suitable method to produce an enlarged head 32 which engages the second plate 22.

Figure 3:
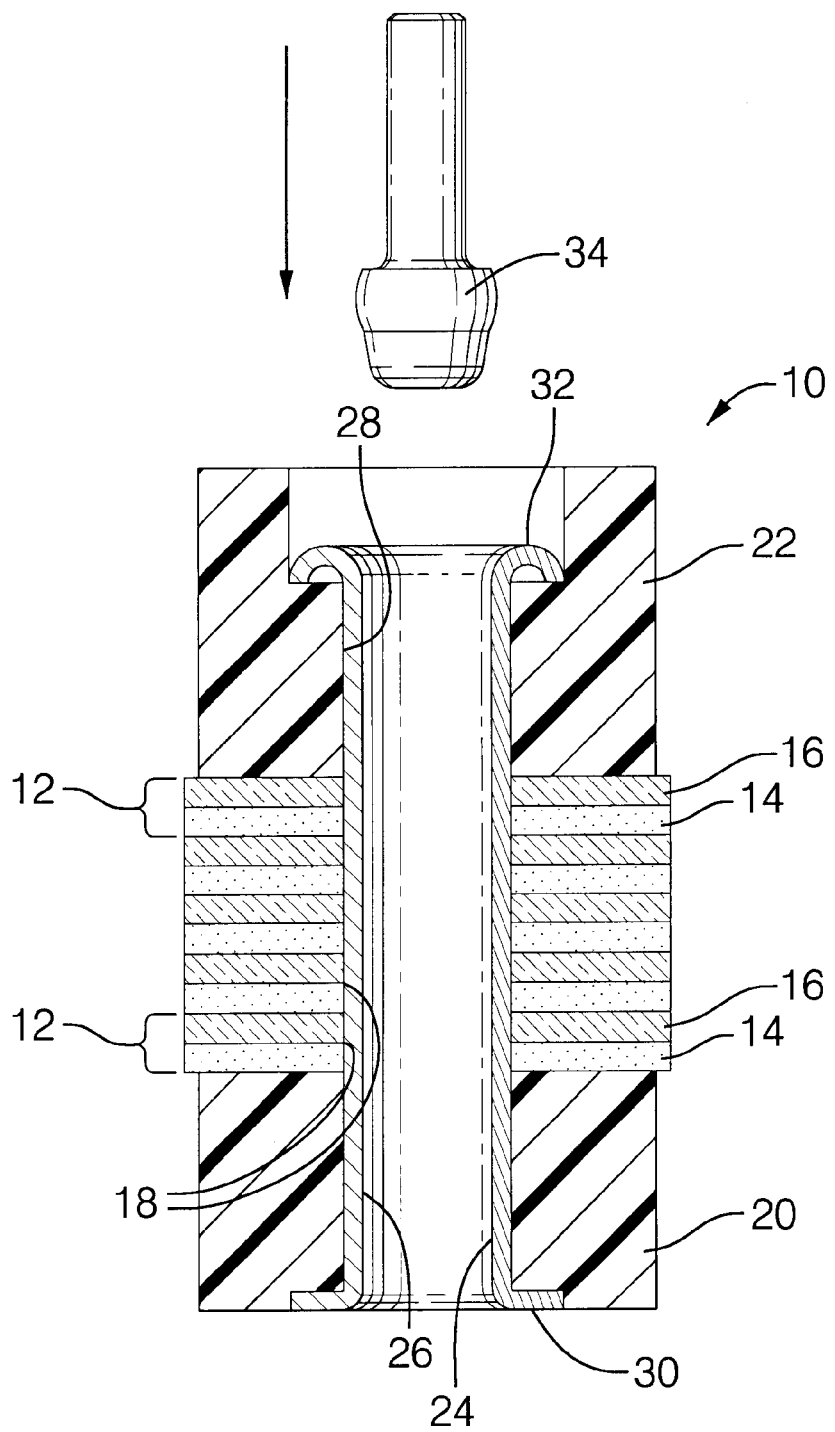
FIG. 3 is a cross-sectional view of the device of FIG. 2 showing a preferred additional step which can be taken in the method in accordance with the present invention.

The rivet 24, between the enlarged end 30 and the enlarged head 32, has an outside diameter which, relative to the diameter of the connection holes 18 in the FPCs 12, ensures that the rivet makes an electrical connection with the layers 16 of electrically conducting material. In order to enhance this electrical connection, after the enlarged head 32 has been formed, a shaped stamp 34 of suitable outside diameter is preferably pushed through the rivet 24 to increase the outside diameter of the rivet between the end 30 and the head 32—as shown in FIG. 3.

One or both of the plates 20,22 may be a printed circuit board comprising a substantially rigid layer of electrically insulating material with a electrically conducting material thereon, the rivet 24 making an electrical connection with the electrically conducting layer on the printed circuit board.

The above described arrangement makes use of a single rivet, with a single hole 26,28 in each plate 20,22. The present invention also covers a similar arrangement in which the plates 20,22 have a number of holes, and the device 10 uses a number of rivets 24 for electrically and mechanically connecting the FPCs 12.

What is claimed is:

1. A method of connecting a plurality of flexible printed circuits (12) each comprising a layer (14) of electrically insulating material and a layer (16) of electrically conducting material, the method comprising the steps of forming a connection hole (18) through each flexible printed circuit; positioning first and second substantially rigid plates (20,22) of electrically insulating material on either side of the flexible printed circuits with the connection holes in the flexible printed circuits aligned with a corresponding first and second plate hole (26,28) in each of the first and second plates; extending a rivet (24) of electrically conducting material through the aligned connection holes and plate holes to electrically connect with the layers of electrically conducting material on the flexible printed circuits; and enlarging the ends (30,32) of the rivet to secure the flexible printed circuits between the plates.

2. A method as claimed in claim 1, wherein the rivet (24) is initially enlarged at one end (30); then passed through the first plate hole (26) in the first plate (20), the connection holes (18) in the flexible printed circuits (12), and the second plate hole (28) in the second plate (22); and finally enlarged at the other end (32).

3. A method as claimed in claim 1 or claim 2, in which the rivet (24) is tubular, the method comprising the additional step of pushing a shaped stamp (34) through the rivet after the ends (30,32) have been enlarged to increase the outside diameter of the rivet between the enlarged ends.

4. A device (10) for connecting a plurality of flexible printed circuits (12) each comprising a layer (14) of electrically insulating material and a layer (16) of electrically conducting material, and each having a connection hole (18) therethrough, the device comprising a first substantially rigid plate (20) of electrically insulating material having a first plate hole (26) therethrough; a second substantially rigid plate (22) of electrically insulating material having a second plate hole (28) therethrough; and a rivet (24) of electrically conducting material, the rivet extending through, in sequence, the first plate hole in the first plate, the connection holes in the flexible printed circuits, and the second plate hole in the second plate, the rivet being sized to make an electrical connection with the layer of electrically conducting material on each flexible printed circuit, and the rivet having an enlarged head (30,32) at each end to secure the flexible printed circuits between the first and second plates.

5. A device as claimed in claim 4, wherein the first and second plates (20,22) are formed from plastics material.

6. A device as claimed in claim 4, wherein the first and/or the second plate (20,22) is a printed circuit board comprising a substantially rigid electrically insulating layer and an electrically conducting layer, the rivet (24) making an electrical connection with the electrically conducting layer on the printed circuit board.

7. A device as claimed in any one of claims 4 to 6, wherein the rivet (24) is formed from copper.

8. A device as claimed in any one of claims 4 to 6, wherein the rivet (24) is tubular.

9. A device as claimed in any one of claims 4 to 6, wherein the first plate (20) has a plurality of first plate holes (26), the second plate (22) has a plurality of second plate holes (28), and the device (10) comprises a plurality of rivets (24), the rivets extending through aligned first plate and second plate holes in the first and second plates and corresponding connection holes (18) formed in the flexible printed circuits (12).

\* \* \* \* \*